United States Patent
Lee et al.

(10) Patent No.: US 7,375,396 B2
(45) Date of Patent: May 20, 2008

(54) THIN FILM TRANSISTOR AND METHOD OF FABRICATING THE SAME

(75) Inventors: Keun-Soo Lee, Suwon-si (KR); Byoung-Keon Park, Incheon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 235 days.

(21) Appl. No.: 11/019,456

(22) Filed: Dec. 23, 2004

(65) Prior Publication Data

US 2006/0033107 A1   Feb. 16, 2006

(30) Foreign Application Priority Data

Aug. 13, 2004   (KR)   .................. 10-2004-0064046

(51) Int. Cl.
*H01L 27/01* (2006.01)
(52) U.S. Cl. .................................... 257/347; 257/353
(58) Field of Classification Search ................ 257/347, 257/350, 351, 353, 354, 411
See application file for complete search history.

(56) References Cited

U.S. PATENT DOCUMENTS 5,643,826 A * 7/1997 Ohtani et al. ............... 438/162

2005/0037524 A1 * 2/2005 Matsumoto et al. ............ 438/14

FOREIGN PATENT DOCUMENTS

| | | |
|---|---|---|
| CN | 1223459 | 7/1999 |
| JP | 07-226374 | 8/1995 |
| JP | 08-064545 | 3/1996 |
| JP | 09-153457 | 6/1997 |
| KR | 1020020068252 | 8/2002 |
| KR | 1020040070979 | * 8/2004 |

* cited by examiner

*Primary Examiner*—Tuan H. Nguyen
(74) *Attorney, Agent, or Firm*—H.C. Park & Associates, PLC

(57) ABSTRACT

The present invention discloses a thin film transistor and a method of fabricating the same. The thin film transistor includes an insulating substrate; and a semiconductor layer, a gate insulating layer, a gate electrode, an interlayer insulator, and a source/drain electrode which are formed on the substrate, wherein the gate insulating layer is formed of a filtering oxide layer having a thickness of 1 to 20 Å.

8 Claims, 4 Drawing Sheets

THIN FILM TRANSISTOR AND METHOD OF FABRICATING THE SAME

CROSS-REFERENCE TO RELATED APPLICATION

This application claims the benefit of Korean Patent Application No. 2004-64046, filed Aug. 13, 2004, the disclosure of which is hereby incorporated herein by reference in its entirety.

BACKGROUND OF THE INVENTION

1. Field of the Invention

The present invention relates to a thin film transistor and a method of fabricating the same and, more particularly, to a thin film transistor having excellent characteristics and a method of fabricating the same in which a dual capping layer is formed of an oxide layer that a metal catalyst is difficult to diffuse and a nitride layer that a metal catalyst is easy to diffuse, a metal catalyst layer is formed on the dual capping layer, and then a crystallization process is performed to form a polysilicon layer having a large-size grain because the metal catalyst does not easily pass through the oxide layer and so a small amount of metal catalyst contributes a crystallization, and a semiconductor layer is formed of the polysilicon layer.

2. Description of the Related Art

In thin film transistor ("TFT") used in a display device, a semiconductor layer is formed such that an amorphous silicon layer is deposited on a transparent substrate made of a glass or a quartz and the amorphous silicon layer is subjected to a dehydrogenation treatment and then is crystallized.

At this time, the semiconductor layer which constitutes a source, a drain and a channel area is formed by depositing an amorphous silicon layer on a transparent substrate made of a material such as a glass using a chemical vapor deposition ("CVD") technique. The silicon layer deposited directly on the substrate using a CVD technique is an amorphous silicon layer which contains a 12% of hydrogen and thus has a low electron mobility, and when the amorphous silicon layer having such a low electron mobility is heat-treated and crystallized into a silicon layer of crystalloid structure having a high electron mobility, the silicon layer may be damaged since hydrogen contained therein may burst. In order to prevent a burst of hydrogen which may occur during crystallization, a dehydrogenation process is carried out. The dehydrogenation process is performed such that a heat-treatment is performed in the furnace at a temperature of more than about 400° C. for tens of minutes to tens of hours. Then, the dehydrogenated amorphous silicon layer is subject to a crystallization process.

The crystallization technique which crystallizes an amorphous silicon layer to form a poly silicon layer includes a solid phase crystallization technique, an excimer laser crystallization technique, a metal induced crystallization (MIC) technique, and a metal induced lateral crystallization (MILC) technique. The solid phase crystallization technique is one which heat-treats and crystallizes an amorphous silicon layer for several hours to tens of hours at a temperature of less than about 700° C. which is a temperature that may transform a glass which forms a substrate of a display device on which a TFT is formed. The excimer laser crystallization process is one which scans an excimer laser to an amorphous silicon layer to be heated and crystallized at a high temperature for a very short time.

However, the solid phase crystallization technique has disadvantages in that a relatively lengthy processing time is required and a substrate is exposed to a high temperature for a long time and thus may be easy to transform. The excimer laser crystallization technique has also disadvantages in that a high price laser device is needed and also an extrusion may occur on a crystallized surface so that an interface characteristic between a semiconductor layer and a gate insulating layer is bad. The MIC or MILC technique has disadvantages in that a large amount of metal catalyst remains on the polysilicon layer to thereby increase a leakage current of the semiconductor layer of the TFT.

SUMMARY OF THE INVENTION

It is an object of the present invention to provide a a thin film transistor having excellent characteristics and a method of fabricating the same in which after sequentially forming a filtering oxide layer and a capping layer on an amorphous silicon layer and then forming a metal catalyst layer on the capping layer, in a super gain silicon (SGS) crystallization method of crystallizing the amorphous silicon layer by diffusing the metal catalyst through the capping layer and the filtering oxide layer, among the metal catalysts which pass through the capping layer and then are diffused to an interface between the capping layer and the filtering oxide layer, a smaller amount of the metal catalyst are allowed to pass through the filtering oxide layer using a feature that the metal catalyst is not easy to diffuse in the filtering oxide layer and contribute to crystallization, so that a grain size is larger and the remaining metal catalyst is small.

In order to achieve the object, the present invention provides a thin film transistor, comprising: an insulating substrate; and a semiconductor layer, a gate insulating layer, a gate electrode, an interlayer insulator, and a source/drain electrode which are formed on the substrate, wherein the gate insulating layer is formed of a filtering oxide layer having a thickness of 1 to 20 Å.

The present invention further provides a thin film transistor, comprising: an insulating substrate; and a semiconductor layer, a gate insulating layer, a gate electrode, an interlayer insulator, and a source/drain electrode, wherein the gate insulating layer is formed of a filtering natural oxide layer.

The gate insulating layer has a single or dual layer of a silicon oxide layer or/and a silicon nitride layer.

The present invention further provides a method of fabricating a thin film transistor, comprising: preparing an insulating substrate; forming an amorphous silicon layer on the substrate; forming a filtering oxide layer and a capping layer on the amorphous silicon layer; depositing a metal catalyst on the capping layer; performing a first heat-treatment to diffuse the metal catalyst to move to an interface between the filtering oxide layer and the amorphous silicon layer through the capping layer and the filtering oxide layer; performing a second heat-treatment to crystallize the amorphous silicon layer by the diffused metal catalyst to form a polysilicon layer; removing the capping layer; patterning the filtering oxide layer and the polysilicon layer to form a semiconductor layer; forming a gate insulating layer above the substrate; and forming a gate electrode above the substrate, and forming an interlayer insulator and a source/drain electrode.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1A:
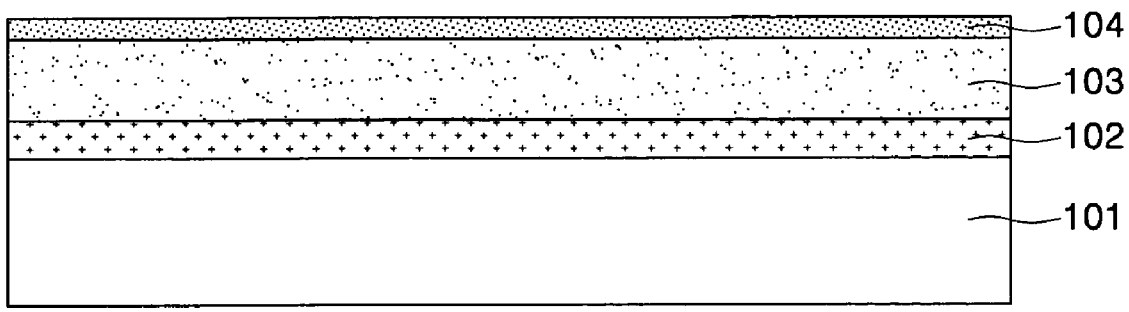
FIGS. 1a to 1d are cross-sectional views illustrating a crystallization process according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIGS. 1a to 1d are cross-sectional views illustrating a crystallization process according to the present invention.

First, FIG. 1a is a cross-sectional view illustrating a process of sequentially forming a buffer layer, an amorphous silicon layer and a filtering oxide layer on a substrate. As shown in FIG. 1a, a buffer layer 102 is formed on an insulating substrate 101 made of a plastic or a glass using a chemical vapor deposition ("CVD") technique or a physical vapor deposition ("PVD") technique. The buffer layer 102 has a single-layer or dual-layer structure of a silicon oxide layer or/and silicon nitride layer. Here, the buffer layer 102 serves to prevent a diffusion of moisture or impurities which may occur on the substrate 101 or to control a heat transfer speed during a crystallization process, thereby helping a crystallization of the semiconductor layer.

Subsequently, an amorphous silicon layer 103 is formed on the buffer layer 102. Typically, the amorphous silicon layer 103 is formed using a CVD technique. The amorphous silicon layer formed using a CVD technique has a gas such hydrogen which decreases an electron mobility, and thus a dehydrogenation process is performed so that hydrogen does not remain in the amorphous silicon layer.

Then, a filtering oxide layer 104 is formed on the amorphous silicon layer 103. The filtering oxide layer 104 is formed of a silicon oxide layer in which a metal catalyst is not easy to diffuse.

The silicon oxide layer may be formed by a deposition using a CVD technique or a PVD technique, or using a thermal oxide layer or a natural oxide layer using a UV oxidation technique, an oxygen plasma technique, or a natural oxidation technique. The CVD or PVD technique is performed such that an oxide layer is deposited on the amorphous silicon layer. The UV oxidation technique, the oxygen plasma technique, or the natural oxidation technique is performed such that a UV light is irradiated to a surface of the amorphous silicon layer to form a thermal oxide layer, or a thermal oxide layer is formed by heating the substrate, or an oxygen plasma is applied to a surface of the amorphous silicon layer to form a thermal oxide layer, or the amorphous silicon layer is exposed to the air or a vacuum which contains oxygen during several seconds to tens of minutes to thereby form a natural oxide layer.

A preferred method of forming the filtering oxide layer is the oxygen plasma technique. The oxygen plasma technique for forming the thermal oxide layer is performed under a condition of a process power of 100 to 1,000 W, a process time of 10 to 1,000 seconds, a process pressure of 70 to 400 Pa. Another preferred method is a method that a surface of the amorphous silicon layer is exposed to the air or a vacuum which contains oxygen so that a natural oxide layer is naturally formed on a surface of the amorphous silicon layer.

Here, a thickness of the filtering oxide layer is in a range of 1 to 20 Å. This is because a thickness of less than 1 Å means that the filtering oxide layer hardly remains and a thickness of more than 20 Å means that a metal catalyst hardly passes through the filtering oxide layer, which makes it impossible to crystallize the amorphous silicon layer.

Figure 1B:
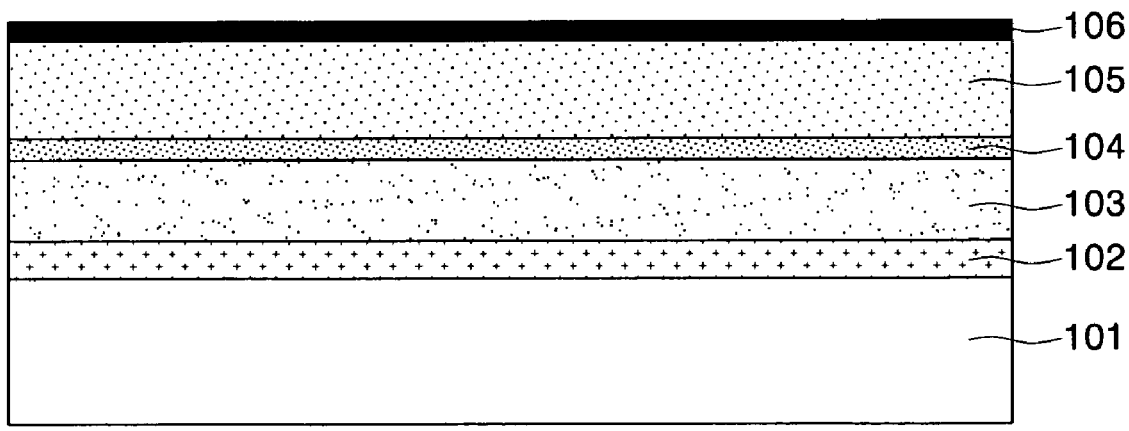

FIG. 1b is a cross-sectional view illustrating a process of forming a capping layer and a metal catalyst layer on the filtering oxide layer. As shown in FIG. 1b, a capping layer 105 is formed on the filtering oxide layer 104. The capping layer is preferably formed of a silicon nitride layer that a metal catalyst can be diffused by a heat-treatment process and may have a dual-layer structure of a silicon nitride layer and a silicon oxide layer. The capping layer 105 is formed using a CVD or PVD technique. A thickness of the capping layer is in a range of 1 to 2,000 Å.

Subsequently, a metal catalyst layer 106 is formed on the capping layer. The metal catalyst layer is formed of one of Ni, Pd, Ti, Ag, Au, Al, Sn, Sb, Cu, Co, Mo, Tr, Ru, and Rh, and preferably of nickel (Ni).

During a MIC or MILC technique, it is required to precisely control a thickness or density of the metal catalyst layer. This is because after the crystallization process the metal catalyst may remain on a surface of a polysilicon layer, resulting in an increase of a leakage current of the TFT. However, in the present invention, there is no need of precisely controlling a thickness or density of the metal catalyst layer, that is, the metal catalyst layer may be formed at a relatively thick thickness. This is because the filtering oxide layer filters the metal catalysts which are diffused so that just a small amount of a metal catalyst contribute to a crystallization, and most of them do not pass through the filtering oxide layer so that it does not contribute to a crystallization.

Figure 1C:
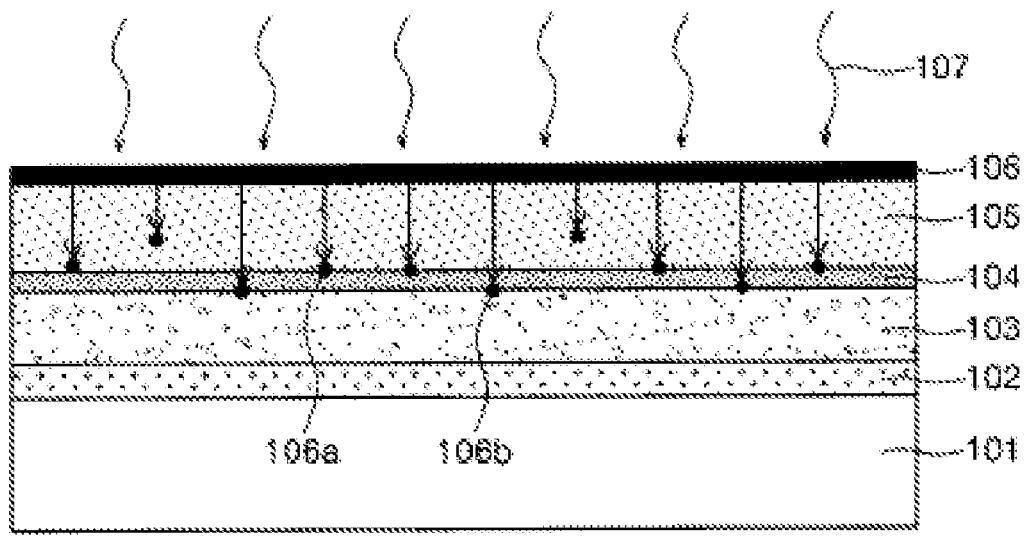

FIG. 1c is a cross-sectional view illustrating a process of diffusing metal catalysts through the capping layer and the filtering oxide layer by performing a first heat-treatment process and moving metal catalysts to an interface between the filtering oxide layer and the amorphous silicon layer. As shown in FIG. 1c, the substrate on which the buffering layer, the amorphous silicon layer, the filtering oxide layer, the capping layer, and the metal catalyst layer are formed is subjected to a first heat-treatment process 107, so that some of the metal catalysts of the metal catalyst layer 106 move to a surface of the amorphous silicon layer 103. That is, among the metal catalysts 106a and 106b which are diffused through the capping layer 105 due to the first heat-treatment process, just a small amount of metal catalysts 106b passes through the filtering oxide layer to be diffused to a surface of the amorphous silicon layer, and most of them do not reach nor pass through the filtering oxide layer. Therefore, an amount of the metal catalyst that reaches a surface of the amorphous silicon layer depends on a diffusion blocking ability of the filtering oxide layer, and a diffusion blocking ability of the filtering oxide layer is closely related to a thickness thereof. That is, as a thickness of the filtering oxide layer is thick, an amount of the catalyst to be diffused is smaller and a size of a grain is bigger, and as a thickness of the filtering oxide layer is thin, an amount of the catalyst to be diffused is more and a size of a grain is smaller.

Here, the first heat-treatment process of diffusing the metal catalyst is performed at a temperature of 200 to 800° C., and uses at least one of a furnace process, a RTA process, a UV process, and a laser process.

Figure 1D:
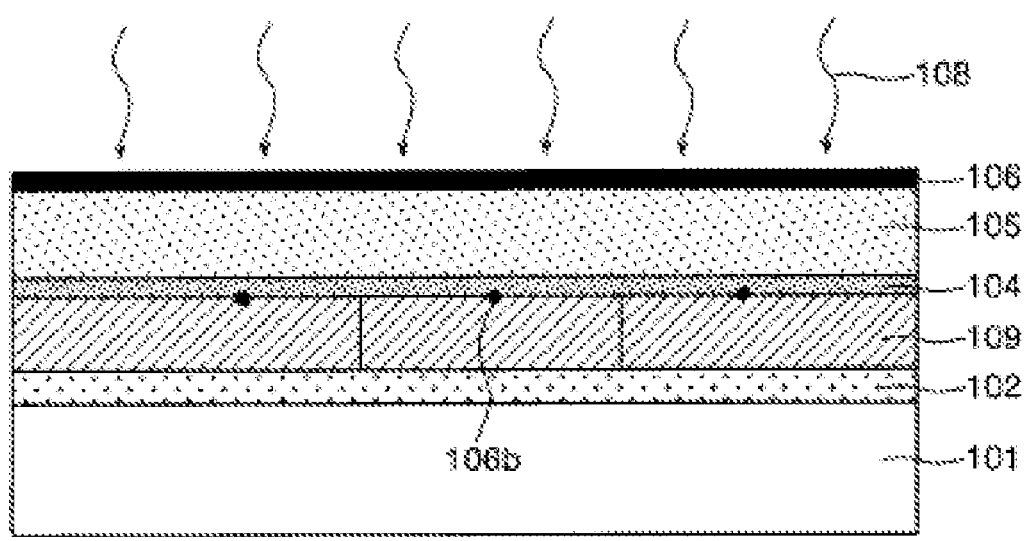

FIG. 1d is a cross-sectional view illustrating a process of crystallizing the amorphous silicon layer due to the diffused metal catalyst by performing a second heat-treatment process 108, thereby forming a polysilicon layer. As shown in FIG. 1d, if the second heat-treatment process 108 is performed, due to the metal catalysts 106b which pass through the capping layer and the filtering layer and are diffused to a surface of the amorphous silicon layer, the amorphous silicon layer is crystallized to form a polysilicon layer 109. That is, the metal catalyst is combined with the amorphous silicon to form a metal silicide, and the metal silicide serves as a core of crystallization and induces crystallization of the amorphous silicon layer.

Here, as a crystallization technique of the present invention, a super grain silicon ("SGS") crystallization technique is used that forms the capping layer on the amorphous silicon layer, forms the metal catalyst layer on the capping layer, heating the metal catalyst layer to diffuse the metal catalysts, and crystallizes the amorphous silicon layer by the diffused metal catalysts to form the polysilicon layer.

Thus, by controlling an amount of a metal which is converted to the metal silicide which is a core of the crystallization, a grain size of the polysilicon can be controlled, and a control of a grain size is determined by the metal catalyst which contributes to the crystallization. Thus, a grain size of the polysilicon can be controlled by a diffusion blocking ability of the filtering oxide layer. That is, a grain size of the polysilicon can be controlled by controlling a thickness of the filtering oxide layer.

In summary, as a thickness of the filtering oxide layer is thick, that is, a thickness of the filtering oxide layer is close to 20 Å, a grain size of the polysilicon layer is larger, whereas as a thickness of the filtering oxide layer is thin, that is, a thickness of the filtering oxide layer is close to 1 Å, a grain size of the polysilicon layer is smaller.

Here, if a thickness of the filtering oxide layer is more than 20 Å, the metal catalysts are hardly diffused, crystallization does not occur, whereas if a thickness of the filtering oxide layer is less than 1 Å, the filtering oxide layer has a meaning. Thus, it is preferred that a thickness of the filtering oxide layer is in a range of 1 to 20 Å.

The second heat-treatment process of FIG. 1d is performed without removing the capping layer and the metal catalyst layer. However, before the second heat-treatment process, the capping layer and the metal catalyst layer may be removed. Also, the metal catalyst layer may be removed after the first heat-treatment process, and the capping layer may be removed after the second heat-treatment process. Here, the second heat-treatment process is performed at a temperature of 400 to 1,300° C. and may use one or more of a furnace process, a RTA process, a UV process, and a laser process.

Figure 2:
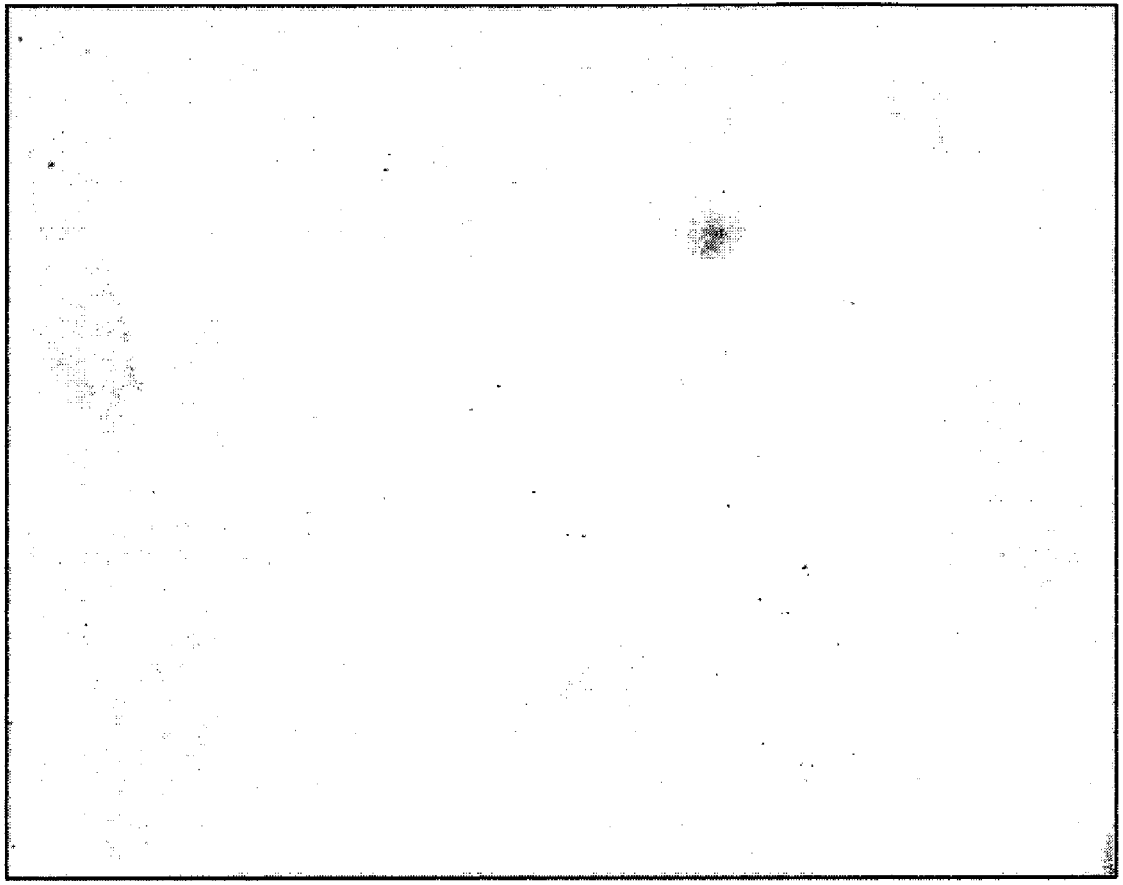
FIG. 2 is a photograph illustrating a plan of a polysilicon layer according to the present invention.

FIG. 2 is a photograph illustrating a plan of the polysilicon layer fabricated according to the present invention. The polysilicon layer of the FIG. 2 is the polysilicon layer fabricated by a process of FIGS. 1a to 1d. A crystallization process of the polysilicon layer is simple because there is no need for precisely controlling a thickness of the metal catalyst layer, and also it has less alien metal substance which remains on the polysilicon layer than a conventional MIC or MILC technique, whereby the polysilicon layer having excellent characteristics which is small in leakage current, large in gain size and high in electron mobility can be performed.

Figure 3:
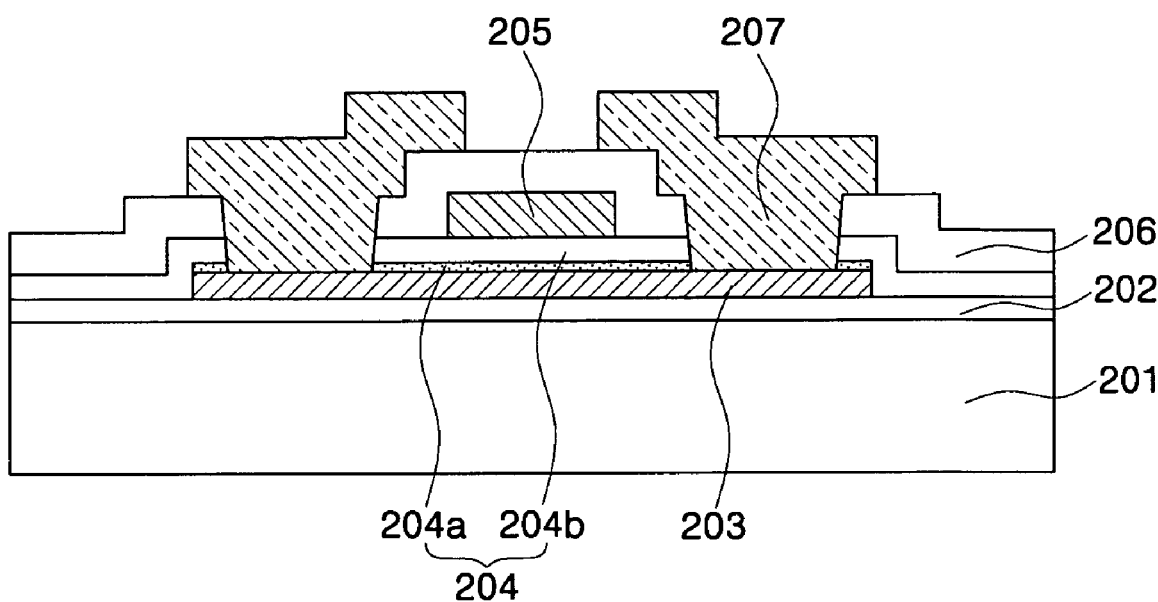
FIG. 3 is a cross-sectional view illustrating a process of fabricating a thin film transistor using the polysilicon layer fabricated according to the present invention

FIG. 3 is a cross-sectional view illustrating a process of fabricating a TFT using the polysilicon layer fabricated according to the present invention. As described in FIGS. 1a to 1d, a polysilicon layer crystallized by a SGS crystallization and a filtering oxide layer are formed on a substrate 201 having a buffer layer 202, and as shown in FIG. 3, the polysilicon layer and the filtering oxide layer are patterned to form a semiconductor layer 203 and a filtering oxide layer pattern 204a. At this time, the semiconductor layer has excellent leakage current in that a small amount of metal catalyst remains on the semiconductor layer due to the filtering oxide layer in comparison to that formed by different conventional crystallization techniques.

Thereafter, a single or dual layer of a silicon oxide layer or/and a silicon nitride layer 204b is formed on the substrate having the filtering oxide layer pattern 204a and the semiconductor layer 203. Here, the filtering oxide layer pattern 204a and the single or dual layer of the silicon oxide layer or/and the silicon nitride layer 204b serve as a gate insulating layer 204 of the TFT.

Subsequently, a gate electrode 205 is formed on a predetermined portion of the gate insulating layer 204, and an interlayer insulator 206 is formed to protect a lower part structure. The interlayer insulator 206 and the gate insulating layer 204 are etched to form contact holes, and then source and drain electrodes 207 are formed to fill the contact holes, thereby completing the TFT.

The fabricated TFT is a TFT in which an amount of the metal catalyst is controlled by the filtering oxide layer so that a small amount of metal catalyst remains compared to the MIC or MILC technique, and the semiconductor layer has a large grain size of the polysilicon layer, and the gate insulating layer is formed of a part of the filtering oxide layer.

As described herein before, the TFT fabricated according to the present invention has excellent characteristics in that an amount of the metal catalyst which contributes to crystallization is controlled by the filtering oxide layer that the metal catalyst is difficult to diffuse, the polysilicon layer having a large grain size is formed by the controlled metal catalyst, and an amount of the metal catalyst which remains on the polysilicon layer is minimized.

What is claimed is:

1. A thin film transistor, comprising:
   an insulating substrate; and
   a semiconductor layer, a gate insulating layer, a gate electrode, an interlayer insulator, and a source/drain electrode which are formed on the substrate,
   wherein the gate insulating layer comprises a filtering oxide layer having a thickness of 1 to 20 Å and the semiconductor layer is formed of a polysilicon layer crystallized by a super grain silicon (SGS) crystallization technique.

2. The transistor of claim 1, wherein the gate insulating layer further comprises a single or dual layer of a silicon oxide layer or/and a silicon nitride layer.

3. The transistor of claim 1, wherein the filtering oxide layer filters a diffusion of a metal catalyst so that a small amount of the metal catalyst is diffused.

4. The transistor of claim 1, wherein the filtering oxide layer is deposited by a CVD or PVD technique or is an oxide layer formed by a UV oxidation technique, a thermal oxidation technique, an oxygen plasma oxidation technique or a natural oxidation technique.

5. The transistor of claim 1,
   wherein the filtering oxide layer is a filtering natural oxide layer.

6. The transistor of claim 5, wherein the gate insulating layer further comprises a single or dual layer of a silicon oxide layer or/and a silicon nitride layer.

7. The transistor of claim 5, wherein the filtering natural oxide layer filters a diffusion of a metal catalyst so that a small amount of the metal catalyst is diffused.

8. The transistor of claim 5, wherein the filtering natural oxide layer is naturally formed natural oxide layer that a surface of the amorphous silicon layer is exposed to the air or a vacuum.

* * * * *